(12) United States Patent
Jain

(10) Patent No.: US 8,772,118 B2
(45) Date of Patent: Jul. 8, 2014

(54) OFFSET SCREEN FOR SHALLOW SOURCE/DRAIN EXTENSION IMPLANTS, AND PROCESSES AND INTEGRATED CIRCUITS

(75) Inventor: Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/484,592

(22) Filed: May 31, 2012

(65) Prior Publication Data

US 2013/0009251 A1    Jan. 10, 2013

Related U.S. Application Data

(60) Provisional application No. 61/505,803, filed on Jul. 8, 2011.

(51) Int. Cl.
*H01L 21/336* (2006.01)
*H01L 21/66* (2006.01)

(52) U.S. Cl.
USPC ............................ 438/297; 438/478; 438/197

(58) Field of Classification Search
CPC ............... H01L 21/823864; H01L 21/823468; H01L 27/09
USPC .......................................... 438/297, 478, 197
See application file for complete search history.

(56) References Cited

U.S. PATENT DOCUMENTS

| | | | | |
|---|---|---|---|---|
| 6,245,623 B1 * | 6/2001 | Ju et al. | ........................... | 438/305 |
| 6,383,881 B1 * | 5/2002 | Akram et al. | ................. | 438/303 |
| 6,403,425 B1 * | 6/2002 | Ang et al. | ..................... | 438/283 |
| 6,468,860 B1 * | 10/2002 | Polavarapu et al. | .......... | 438/257 |
| 6,808,997 B2 | 10/2004 | Jain et al. | | |
| 7,033,879 B2 | 4/2006 | Hornung et al. | | |
| 7,098,099 B1 | 8/2006 | Hornung et al. | | |
| 7,297,605 B2 | 11/2007 | Jain et al. | | |
| 7,537,988 B2 * | 5/2009 | Ekbote et al. | .................. | 438/199 |
| 7,648,868 B2 * | 1/2010 | Majumdar et al. | ............ | 438/198 |
| 7,670,917 B2 | 3/2010 | Jain et al. | | |
| 7,858,458 B2 * | 12/2010 | Mathew | ........................ | 438/197 |
| 7,952,142 B2 * | 5/2011 | Wu | ............................... | 257/336 |
| 8,076,193 B2 * | 12/2011 | Sato et al. | ..................... | 438/216 |
| 8,258,053 B2 * | 9/2012 | Kronholz et al. | ............. | 438/595 |

(Continued)

OTHER PUBLICATIONS

Eyben, P., et al. SSRM and SCM observation of enhanced lateral As- and BF2-diffusion induced by nitride spacers. Mat Res. Soc. Symp. vol. 610, paper b2.2. Materials Research Society, 2000. 12pp., Figs. 1-8.

(Continued)

*Primary Examiner* — Matthew W Such
*Assistant Examiner* — Stephen C Smith
(74) *Attorney, Agent, or Firm* — Jacqueline J. Garner; Frederick J. Telecky, Jr.

(57) ABSTRACT

A process of integrated circuit manufacturing includes providing (32, 33) a spacer on a gate stack to provide a horizontal offset over the channel region for otherwise-direct application (34) of a PLDD implant dose in semiconductor, additionally depositing (35) a seal substance to provide a screen thickness vertically while thereby augmenting the spacer on the gate stack to provide an increased offset horizontally from the gate stack and form a horizontal screen free of etch, and subsequently providing (36) an NLDD implant dose for NLDD formation. Various integrated circuit structures, devices, and other processes of manufacture, and processes of testing are also disclosed.

8 Claims, 3 Drawing Sheets

(56) References Cited

U.S. PATENT DOCUMENTS

| | | | |
|---|---|---|---|
| 8,304,840 B2* | 11/2012 | Teo et al. | 257/382 |
| 8,314,463 B2* | 11/2012 | Cai et al. | 257/351 |
| 8,329,564 B2* | 12/2012 | Cai et al. | 438/478 |
| 8,338,887 B2* | 12/2012 | Lindsay et al. | 257/330 |
| 8,338,894 B2* | 12/2012 | Griebenow et al. | 257/369 |
| 8,450,194 B2* | 5/2013 | Waite et al. | 438/524 |
| 2008/0090368 A1 | 4/2008 | Fisher et al. | |
| 2008/0268625 A1 | 10/2008 | Feudel et al. | |
| 2009/0170259 A1 | 7/2009 | Hornung et al. | |
| 2010/0193874 A1 | 8/2010 | Ito et al. | |
| 2010/0237410 A1 | 9/2010 | Zhu et al. | |
| 2012/0056275 A1 | 3/2012 | Cai et al. | |
| 2013/0059424 A1* | 3/2013 | Lindsay et al. | 438/270 |
| 2013/0113051 A1* | 5/2013 | Cai et al. | 257/402 |
| 2013/0161763 A1* | 6/2013 | Ando et al. | 257/408 |

OTHER PUBLICATIONS

Eyben, P., et al. SSRM and SCM observation of modified lateral diffusion of As, BF2 and Sb induced by nitride spacers. Mat. Res. Soc. Symp. vol. 669. Materials Research Society, 2001. 6pp., Figs. 1-5.

Kavalieros, J., et al. Tri-Gate Transistor Architecture with High-K Gate Dielectrics, Metal Gates and Strain Engineering. Intel. Undated. 2pp. Downloaded May 13, 2011. http://download.intel.com/technology/silicon/tri-gate_paper_VLSI_0606.pdf, Figs. 1-4b, 6-9b.

* cited by examiner

US 8,772,118 B2

OFFSET SCREEN FOR SHALLOW SOURCE/DRAIN EXTENSION IMPLANTS, AND PROCESSES AND INTEGRATED CIRCUITS

CROSS-REFERENCE TO RELATED APPLICATIONS

This application is related to provisional U.S. Patent Application "Offset Screen for Shallow Source/Drain Extension Implants, and Processes and Integrated Circuits" Ser. No. 61/505,803, (TI-70020PS) filed Jul. 8, 2011, for which priority is claimed under 35 U.S.C. 119(e) and all other applicable law, and which is incorporated herein by reference in its entirety.

STATEMENT REGARDING FEDERALLY SPONSORED RESEARCH OR DEVELOPMENT

Not applicable.

FIELD OF THE INVENTION

The field of the invention includes electronic integrated circuits and integrated circuit substructures, processes of manufacturing integrated circuits, and processes of testing integrated circuits. Among other integrated circuits, various integrated circuits such as analog and mixed signal circuits, digital circuits, wireless circuits, application specific integrated circuits (ASICs), etc., can benefit from the embodiments.

BACKGROUND

Processes of making integrated circuit structures have line widths of microscopic dimensions currently measured in nanometers (nm). Process generations having different size line widths from each other, and thought of in general, are called process nodes. An integrated circuit or "chip" generally has a semiconductor substrate (e.g. silicon Si, silicon germanium SiGe, or gallium arsenide GaAs, or other substance), or instead may have an insulating layer, on which semiconductor devices like transistors and diodes are fabricated in a semiconductor on insulator (SOI) technology. Over the semiconductor devices, alternating layers of insulator and conductor are provided, like a layer cake on a cake pan. The conductor layers are patterned and etched into microscopic conducting lines. The conducting lines are used to interconnect the semiconductor devices to make integrated circuits of varying complexity that under a microscope look like a grid of streets, except at many levels. The conductor layers often are metal but any electrical conductive substance can be useful. One example is polysilicon (poly), which is doped and made conductive for making transistor gates and can also form interconnect lines to the gates. Metal layers for wires are often provided above the poly interconnect layer, and interlayer dielectric ILD separates the various layers. Conductive studs called vias are made or deposited through one or more of the ILD layers to electrically connect the conductor layers. Conductive studs are called contacts when they connect the conducting lines from a lower level through dielectric called PMD to integrated semiconductor devices.

These integrated semiconductor devices include field effect transistors (FETs or MOSFETs), e.g. having a variously-doped structure including heavily-doped source and drain regions of one conductivity type (e.g., n-type in an n-FET) separated by an oppositely-doped channel region (e.g. p-type). (p-FETs have the types reversed.) The electric charge carriers for electric current in n-type material are electrons, and in p-type material they are called holes. Dopants are impurities that are intentionally originally included or subsequently introduced in the silicon or other substrate or layer, to establish the n-type or p-type conductivity. One method of such introduction is implanting, which causes energetic dopant ions to strike the surface of the substrate and create doped areas therein. The opposite-type source/channel and channel/drain regions form p-n junctions that without more would largely impede electrical conduction, but the use of a gate and introduction of voltage thereon controls electrical conduction across the channel length between the source and drain of the FET. The gate is provided as a control structure over the channel and separated from the channel by a thin gate dielectric as insulation. The gate may have a protective, insulating spacer formed laterally on either side of the gate. Application of different voltages to the gate can turn on channel conduction above a threshold voltage $V_T$ and sharply turn off channel conduction below the threshold voltage in digital switching transistors, or can intermediately vary the channel conduction in analog transistors. The ability of the FET structure to work together as a whole to effectively turn channel conduction on and off is especially important when the FET is used as a switching device, of which digital logic circuits can be composed.

CMOS (complementary metal oxide semiconductor) integrated circuit devices have both n-FETs and p-FETS. These devices are scaled or revised to make them smaller in physical dimensions of FETs and other structures at successively more advanced technology nodes. For a given fabrication process node, the node value (e.g., 28 nm) is approximately related to a smallest attainable gate length (the narrow dimension of the gate parallel to the channel length), which in turn is related to photolithography constraints at that node. (Patterned integrated circuit structures are realized by photographic exposure and chemistry-based equipments.) Small gate length or small channel length relates to desired high transistor switching speed and trades off with undesired current leakage that also increases as channel length decreases. Notice that transistors with longer gate lengths than the smallest attainable are also readily established using a given process node. Accordingly, providing transistors with such longer gate lengths in many less speed-critical circuit paths of the integrated circuit helps save power, while providing transistors with the short gate length in more speed-critical circuit paths satisfies circuit timings and delivers speed of performance.

At advanced process nodes with their smaller geometries, those processes and resulting field effect transistors (FETs) can suffer current leakage, variations in threshold voltage among seemingly similar FETs, decreased charge carrier mobility, injection of hot (higher energy) carriers from points of high electric field concentration, lowered switching threshold voltage due to short channel length and proximity of the FET drain (called drain induced barrier lowering DIBL). Shallow junctions are implanted as extensions to the more-heavily doped source and drain, to provide a decreasing doping concentration between the source/drain and the channel, which reduces electric field concentrations. These are called lightly doped drain (LDD) or medium doped drain (MDD) and prefixed with the p- or n-conductivity type of the transistor to fabricate which the LDD applies. ("LDD" is used to refer to either or both LDD and MDD herein.)

Some source/drain processing sequences are called PLDD and NLDD, which refer to p-type and n-type Lightly Doped Drain. Some LDD may execute a less-doped first implant before spacer formation, and more intensely doped implant after spacer formation. With respect to the resulting source/drain regions, the application of drain voltage causes an electric field strength or concentration that is less in the less-doped LDD drain area near the FET channel compared to the electric field that would result after applying that drain voltage to a more highly doped implant. Since the electric field is what accelerates and imparts energy to charge carriers in transistor operation, lessening the electric field strength reduces production of hot-carriers by the electric field there. (So-called hot-carriers are high-energy charge carriers that can degrade the gate oxide and reduce device reliability over time. "Hot" here does not refer to device temperature.)

Providing transistors with different gate lengths in a same process node on test chips also facilitates observation and verification of a lightly doped drain LDD process and its effect on drain induced barrier lowering DIBL and gate-to-drain capacitance Cgd. Observation of how electrical parameters vary with gate length may include studying sensitivity of DIBL to Cgd at shorter and longer gate lengths.

Source/drain extensions are areas of one or both the source and drain regions that extend toward each other and narrow the channel. As scaling proceeds to more advanced (smaller, more finely dimensioned) process technology nodes, it is becoming increasingly problematic to reduce the junction depth of source/drain extensions. This problem occurs for the nMOSFET field effect transistor at the 32 nm or 28 nm node for one instance (and can occur both at less-advanced nodes and at more-advanced nodes) due, for instance, to the lack of availability of large molecules of n-type dopants that could allow operation of ion implanters at practical implant-effective energies while providing low energy or velocity for individual dopant atoms so the implant is scaled shallower or less deep.

One might attempt to achieve shallow doping by ion implanting through a screen made up of one or more layers of deposited material to reduce the energy or velocity of incoming ions so that they are implanted into the semiconductor substrate at lower energy, and thus shallower, without having to operate the ion implanter at impractically low energies. However, after the anneal (heating step to distribute dopant) that should follow the ion implantation process, such screened dopant is prone to excessive lateral diffusion that degrades FET transistor performance. These complexities have frustrated attempts to fabricate the desired nMOSFET structure.

Such a screening approach for such LDD scaling to a more advanced process node might screen the n-type dopant during implantation in FIG. 1 to reduce the energy of the dopants entering silicon. Reduction of junction depth apparently does occur, as seen in one-dimensional (1D) SIMS data. (Secondary Ion Mass Spectrometry). SIMS sensitively detects secondary ions from a surface subjected to primary ions. In resulting semiconductor devices such screening approach has the potential to improve short channel effects SCE (such as drain induced barrier lowering DIBL and subthreshold swing). Unfortunately, such screening approach apparently also leads to excessive lateral diffusion as seen in Cgd (gate-drain capacitance) that can undesirably affect switching speed and effective gate input capacitance. As LDD junctions get shallower, e.g. with arsenic dopant, enhanced lateral diffusion apparently leads to increased gate-to-drain overlap under reported observations using SSRM (Scanning Spreading Resistance Microscopy) and SCM (Scanning Capacitance Microscopy), see Eyben, P., et al. SSRM and SCM observation of enhanced lateral As- and BF2-diffusion induced by nitride spacers. Mat. Res. Soc. Symp. Vol. 610, paper b2.2. Materials Research Society, 2000. ;see Eyben, P., et al. SSRM and SCM observation of modified lateral diffusion of As, BF2 and Sb induced by nitride spacers. Mat. Res. Soc. Symp. Vol. 669. Materials Research Society, 2001.

A form of a differential offset spacer processing has been used to increase the offset of the pMOS relative to the nMOS, because at previous nodes, scaling of the PLDD was the bigger problem. A sequence, see FIG. 1, might implant NLDD after polysilicon oxidation (polyox or Re-Ox), deposit a layer (with different spacer thickness), might do an intermediate anneal, etch, and implant PLDD—variations depending on layer material for such different spacer thickness. For some other background, see U.S. Pat. No. 7,537,988 "Differential Offset Spacer" (TI-64864) dated May 26, 2009, which is hereby incorporated herein by reference.

For still other background, see US Patent Application Publication 20080268625, Feudel et al., dated Oct. 30, 2008 and US Patent Application Publication 20100193874, Ito et al., dated Aug. 5, 2010. Compounding the problems of reliably obtaining desired transistor performances are problems posed by engineering economy because of the cost of a growing multitude of process steps.

Accordingly, significant departures and alternatives in structures, circuits, processes of manufacture, and processes of testing, for addressing the above considerations and problems would be most desirable.

SUMMARY OF THE INVENTION

In general, and in a process form of the invention for integrated circuit manufacturing, the process includes providing a spacer on a gate stack to provide a horizontal offset over the channel region for otherwise-direct application of a PLDD implant dose in semiconductor, additionally depositing a seal substance to provide a screen thickness vertically while thereby augmenting the spacer on the gate stack to provide an increased offset horizontally from the gate stack and form a horizontal screen free of etch, and subsequently providing an NLDD implant dose for NLDD formation.

In general, and in another process of the invention for integrated circuit manufacture, the process includes gate etching to define a gate structure having edges, forming a spacer on the gate structure, performing ion implantation to form p-type lateral drain diffusion (PLDD) source/drain extensions, depositing at least one implant-energy-reducing layer to augment an offset of the spacer from the gate structure and form a horizontal screen free of etch, an n-type lateral drain diffusion (NLDD) implanting of n-type source/drain extensions.

In general, and in another process of the invention for integrated circuit manufacture of an integrated circuit including a set of p-type and n-type transistors for the integrated circuit, the process includes etching gate structures for the transistors in the set respectively, performing a shared spacer formation to form a set of resulting initial spacer structures all having one substantially same initial spacer offset on the gate structures for all the transistors in the set, subjecting only a subset of the initial spacer structures to p-type lateral drain diffusion (PLDD) subject to that initial spacer offset; and adding a seal substance only on at least some remaining initial spacer structures for at least some remaining transistors in the set other than in that subset, said seal substance augmenting the initial spacer offset to establish augmented spacer structures having an augmented spacer offset lying in a range 1.5 to 2.5 times the initial spacer offset, and said seal substance also providing a horizontal screen laterally of the augmented spacer structures, and subjecting only the augmented spacer structures to n-type lateral drain diffusion (NLDD) through the horizontal screen subject to that augmented spacer offset.

In general, and in a further form of the invention, an integrated circuit article includes a set of p-type and n-type transistors having gate structures of the transistors in the set respectively, a set of initial spacer structures resulting from a shared spacer formation and having one substantially same initial spacer offset on the gate structures of all the transistors in the set and wherein only the p-type transistors have been subjected to p-type lateral drain diffusion (PLDD) subject to that initial spacer offset, and a seal substance disposed on the initial spacer structures of the n-type subset of transistors only, said seal substance augmenting the initial spacer offset and providing an augmented spacer offset lying in a range 1.5 to 2.5 times the initial spacer offset and said seal substance also providing a horizontal screen, and wherein only the n-type transistors have been subjected to n-type lateral drain diffusion (NLDD) subject to that augmented spacer offset.

In general, and in another further form of the invention, an integrated circuit includes a gate structure in a range of nodes 32 nm to 28 nm, at least one p-type lateral drain diffusion (PLDD) structure providing a source/drain extension and defining at least a first field effect transistor channel length, and at least one n-type lateral drain diffusion (NLDD) structure providing a source/drain extension defining at least a second field effect transistor channel length offset from the gate structure and the second channel length lying in a range 1.5 to 2.5 times the first channel length, said NLDD structure including arsenic (As) doping in a range $4E15/cm^2$-to-$6E15/cm^2$ and a pocket implant including approximately $5E13/cm^2$ boron doping, and said NLDD structure establishes gate-drain capacitance (Cgd) approximately 0.2 femtofarad per micro-meter.

In general, and in a still further form of the invention, a wafer fabrication testing method includes performing wafer fabrication by running wafers in at least one split lot whereby obtaining at least first and second groups (splits) of wafers having transistors with at least first and second gate lengths and including gate etch and spacer formation and spacer offset augmentation and providing an angled dose for lateral drain diffusion (LDD) so that both the angled dose is increased and a pocket dose is decreased for transistors having the smaller of the first and second gate lengths, and determining a transistor threshold voltage reduction between the splits representing a drain induced barrier lowering (DIBL) voltage and whether DIBL is less than a given DIBL voltage value or not.

Generally, various integrated circuit structures, devices, and processes of manufacture, and processes of testing are disclosed and claimed, all as described herein.

Corresponding numerals or designators in different Figures indicate corresponding parts except where the context indicates otherwise. A minor variation in capitalization or punctuation for the same thing does not necessarily indicate a different thing. A suffix .i or .j refers to any of several numerically suffixed elements having the same prefix.

DETAILED DESCRIPTION OF EMBODIMENTS

A type of embodiments herein solves problems of n-FET scaling and n-FET usj (ultra-shallow junction) scaling to advanced technology nodes for wafer fabrication of integrated circuits.

Figure 1:
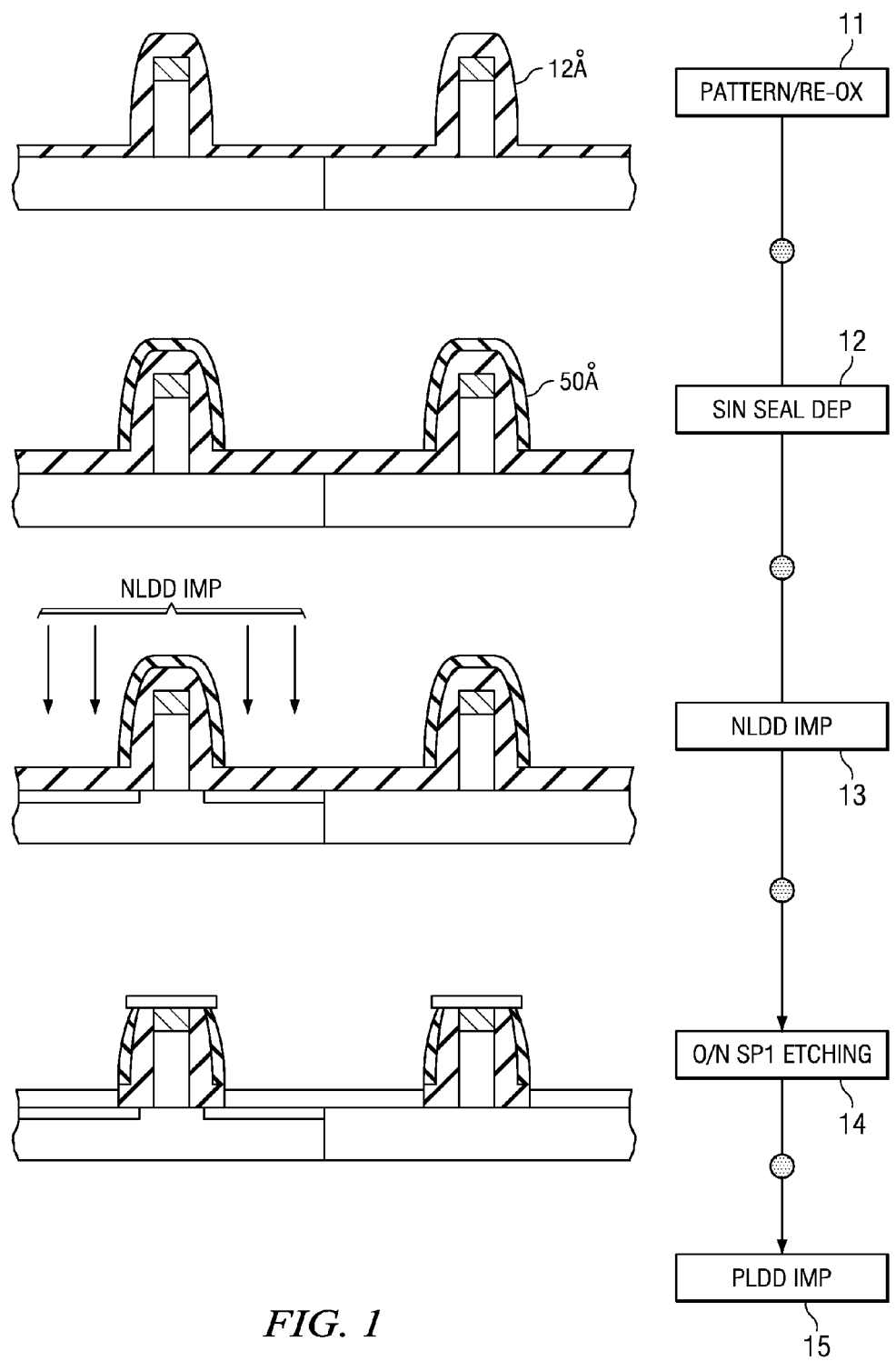
FIG. 1 is a composite diagram of successive cross-sections of a microscopic portion of a semiconductor wafer associated with the corresponding flow diagram boxes describing a manufacturing process.

FIG. 1 illustrates a process as a point of departure. A flow portion commences with a step 11 to perform post poly patterning and re-oxidation RE-OX 12 A ("A" means Angstroms, or units of 0.1 nanometer). Next, SiN seal deposition step 12 deposits 40 A SiN (40 Å of silicon nitride, Angstroms) that produces a seal about 50 Å and spacer SP1 width of about 50 Å. A succeeding step 13 performs NLDD implant. Photoresist keeps the LDD implant for each type from implanting the other type: i.e. n-type NLDD at step 13 then p-type PLDD at step 15 later. A further step 14 proceeds with O/N (oxide/nitride) SP1 spacer etching to provide a resulting spacer SP1 width of approximately forty (40) Å, whereupon PLDD implant is performed at a step 15. This way of doing the process encounters various problems as described as background earlier hereinabove, even though it can be feasible for some purposes. See also U.S. Pat. No. 7,098,099, "Semiconductor Device Having Optimized Shallow Junction Geometries and Method for Fabrication Thereof" dated Aug. 29, 2006, (TI-38765), which is incorporated by reference herein in its entirety.

To obtain shallow junctions, a screen, or thin film of, e.g., silicon nitride SiN or other energy-reducing substance, is laid down to reduce average energy of the implant dose entering the silicon to form sources and drains and thereby makes the LDD junction depth shallower. A manifestation of shallower junction depth is reduced drain induced barrier lowering (DIBL). But gate-to-drain capacitance Cgd between gate and such a shallower drain extension depends on how far the dopant has spread laterally. The lateral extension was found to be relatively high compared to the shallow, vertically-downward penetration even though the average energy of ions was lower due to the screen. Anneal was apparently enhancing the lateral diffusion or may have been the reason. To solve this problem, the FIG. 2 process first provides a single unit (e.g. 40 A) of offset of the dose from the channel region only for PLDD using the spacer on the gate stack. Then, second, the process provides a larger or roughly double (e.g. 80-90 A) offset of the dose from the channel region only for NLDD after additionally providing SiN seal deposition 35. That way, using the spacer on the gate stack provides a double offset, as it is broadly termed herein, from the gate for NLDD formation. The screen in vertical direction (thickness dimension normal to substrate) is same but doubly-offset horizontally from the gate stack due to the augmented spacer. Such process and structure embodiment remarkably prevents the anomalously-excessive lateral diffusion in source/drain formation while desirably obtaining the desirably shallow junction depth. That way, a structure with both the desirably shallow junction depth and a desirably-small lateral extension is obtained with consequently-favorable low DIBL and low Cgd.

The embodiments surmount and solve problems to both reliably obtain desired transistor performances and engineering economy as well. At least one innermost spacer layer is formed and then remains undisturbed throughout the sequence from first spacer formation through PLDD and NLDD. In some embodiments, a spacer with one substantially same width is applied concurrently (saving steps) to at least first and second gate stacks wherein at least a first such gate stack is subject to PLDD and at least a second such gate stack subject to NLDD. The shared spacer formation, spacer structure or inner spacer layer has the same position relative to or adjacent to both such gate stacks. The seal substance offsets the subsequent NLDD implant dose relative to the second gate stack by an additional amount relative to PLDD implant dose, and the augmenting is etch-free (also saving steps). Such augmentation strategy herein and various process sequence embodiments dramatically simplify the process while both reliably obtaining desired performances for different transistors and promoting engineering economy as well. Compare against the background US Patent Application Publication 20080268625, Feudel et al., dated Oct. 30, 2008 and US Patent Application Publication 20100193874, Ito et al., dated Aug. 5, 2010, for instance.

Figure 2:
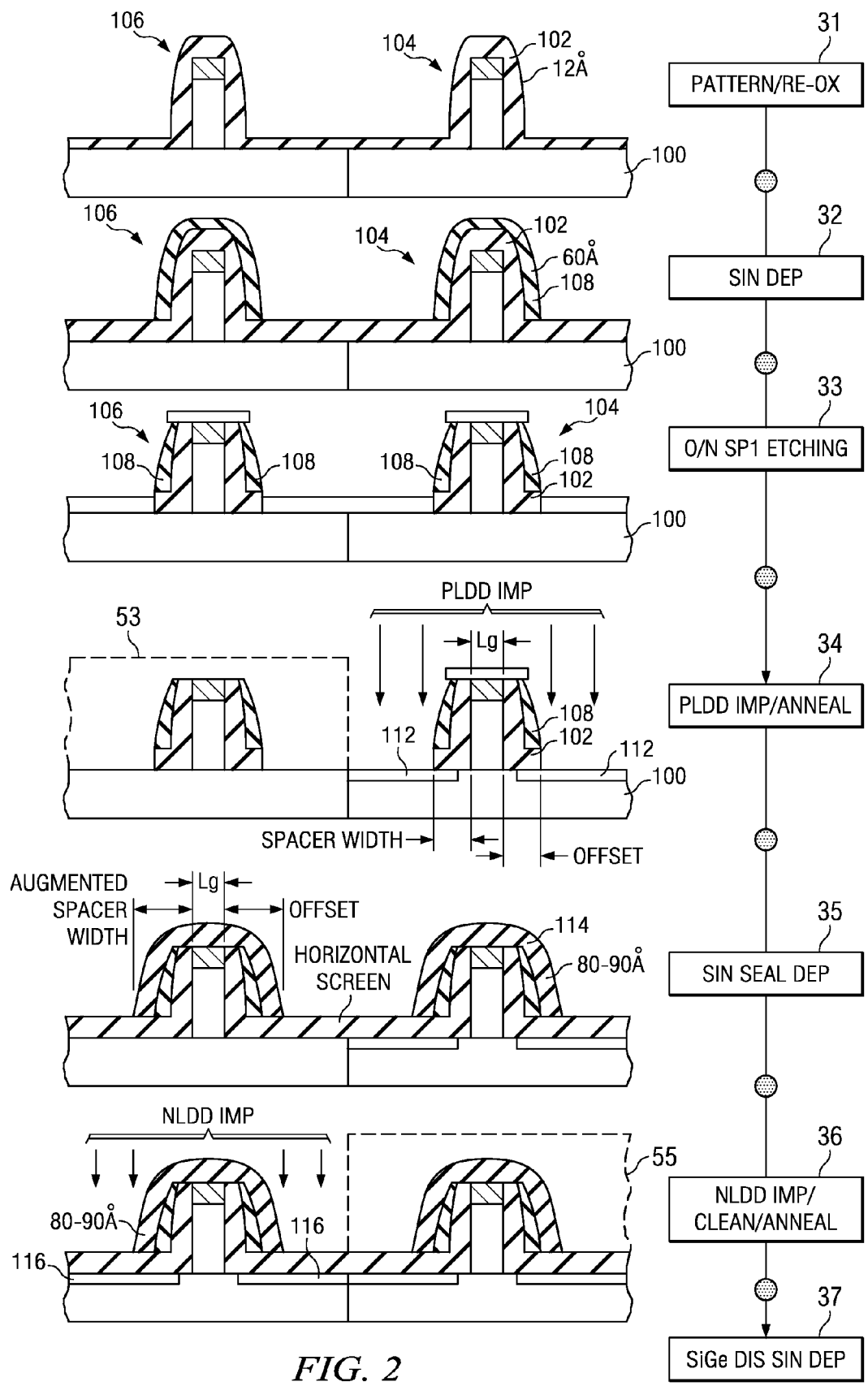
FIG. 2 is a composite diagram of an example of an inventive process embodiment and structure embodiment showing successive cross-sections of a microscopic portion of a semiconductor wafer associated with the corresponding flow diagram boxes depicting a manufacturing process embodiment that produces a structure embodiment.

In FIG. 2, some of the process embodiments deposit a film 102 having one or more layers on the substrate 100 to produce a layered structural embodiment after the etching step that defines the gate electrode structures 104, 106. The process node is, e.g., 54 nm, 45 nm, 32 nm, 28 nm, 22 nm, or less, or otherwise as feasible and useful. At a 32nm or 28 nm process node, such processing appears to be especially useful at the present time. A prior gate etch is suitably followed by an oxidation step 31 if the gate is made of polysilicon, to obtain an oxide layer. (If the gate is metal, then the gate formation occurs and spacer formation occurs according to such metal gate process.) Silicon nitride or other nitride or oxide or other implant-energy reducing material 108 is then deposited in a step 32 to add another layer. The layer is then etched in a step 33 to form an offset from the edge of the gate. The step 33 etch is anisotropic in that the etch (e.g., reactive ion etch RIE) is primarily vertically downward and removes the SiN layer so that its vertical depth becomes essentially zero while the gate SiN spacer thickness is only partially etched away, leaving a remaining gate SiN spacer thickness or offset (unit offset for comparison with an augmented offset in subsequent step 35). The horizontal black bars in steps 33 and 14 signify remaining oxide.

As shown for steps 31-33, least one innermost spacer layer is thus formed and then remains undisturbed throughout the sequence from first spacer formation through PLDD 34 and NLDD 36. The spacer has one substantially same width and is applied concurrently (saving steps) to both of first 104 and second 106 gate stacks, the first such gate stack 104 subject to PLDD and the second such gate stack 106 subject to NLDD. The spacer or inner layers or innermost spacer layer are retained and persist with and occupy the same position relative to both such gate stacks without shuffling, omission, or change of adjacency to one another and the gate stack. The spacer is thus applied with one substantially same width and relative position concurrently both for transistors ultimately receiving PLDD and for transistors ultimately receiving NLDD. This simplifies various process embodiments and promotes engineering economy.

Ion implantation 34 is then carried out to form the PLDD source/drain extensions 112 for the pMOSFET by ion implantation. This ion implantation 34 may be followed by an intermediate spike anneal or laser anneal (or both) step (not shown) to remove any damage or surface disturbance associated with implant step 34 and to partially or fully activate the p-type dopant. Patterned photoresist formations 53, 55 sequentially keep the LDD implant for each type from implanting the other type respectively: i.e. p-type PLDD at step 34 then n-type NLDD at step 36 later. (The photoresist formations 53, 55 are shown dotted because, depending on location of the photoresist formations on the chip with respect to the various sets and subsets of transistors, the photoresist formations may lie in the plane of the cross-section or outside of it.)

Next, a process of depositing an energy-reducing layer(s) 114 like that of step 32 is performed or repeated at step 35, this time to extend the offset of the spacer from the edge of the gate and at the same time form a screen for the nMOSFET source/drain extension implants—no etch like step 33 that followed step 32 is in this particular example carried out on these layers produced by step 35 prior to NLDD implant, etc., step 36. Deposition material in steps 32 and 35 is silicon nitride, for example, although other nitrides and oxides or other energy-reducing materials may be used instead or in addition. The screen shown and resulting from step 35 in FIG. 2 is built as a single layer or in multiple layers from a combination of these materials.

In step 35, the seal substance offsets the NLDD implant dose relative to the second gate stack by an additional amount relative to PLDD implant dose, and the extending or augmenting of offset is etch-free (also saving steps). Various process sequence embodiments employ such augmentation and dramatically simplify the process and further promote engineering economy.

The combination of extended offset (relative to a normal flow in which the n-FETs and p-FETs have the same offset) and the screen thus obtained at step 35, desirably and economically provide both for 1) shallow implants and 2) allowance for increased lateral diffusion, i.e. to prevent the increased lateral diffusion into the channel that could otherwise result from the shallow implant and to reduce, optimize, prevent, or obviate excessive gate-to-drain capacitance Cgd.

In FIG. 2, this type of process embodiment places the p-type source/drain extension before the n-type source/drain extensions 116 in the process flow and thus avoids doing an etch between steps 35 and 36. In other words, this process does not use two etches prior to the LDD implants (PLDD and NLDD) at steps 34, 36 respectively. Instead, an etch is involved only at the step 33 prior PLDD implant 34. Notice that this process embodiment is not just a swap of PLDD and NLDD, due to the double offset for NLDD but not for PLDD. Also, note the screening (horizontal screen) for the NLDD, both for energy reduction of the dopant incident upon the source/drains during implanting, and for prevention of out-diffusion during the anneal.

As noted, some embodiments thus provide increased offset for the NLDD at step 35 using a process flow that does not add an extra etch step 14 of FIG. 1. Indeed, this remarkable process flow provides a way to offset the NLDD by an additional amount using SiN seal step 35 without an additional etch, and is fully compatible with a silicon-germanium (SiGe) or other suitable material and fabrication process including this process flow. This flow introduces an important flow departure in the LDD loop of an integrated circuit fabrication process.

In this way, a category of the embodiments beneficially provides a simplified process that allows the p-MOSFETs and n-MOSFETs to have source/drain extension offsets that are independent of each other while step 35 screens the n-type extension implant to allow junction depth scaling.

In FIG. 2, an example flow for a deposition process embodiment commences with a step 31 to perform post poly patterning and re-oxidation RE-OX 12 A (Angstroms). Next, SiN deposition step 32 deposits 60 A SiN (60 Å of silicon nitride). A succeeding step 33 performs O/N (oxide/nitride) SP1 etching to provide a SP1 width or offset of approximately fifty (50) Å.

In FIG. 2, the process proceeds to a step 34 that performs PLDD implant. Then a step 35 deposits a silicon nitride SiN seal of about 40 Å additional. Notice that some remanent oxide intentionally remains or can remain from step 33 due to incomplete oxide/nitride spacer (O/N SP1) etching from step 33. At step 35, the result is a 40 Å seal and a spacer SP1 width or offset of approximately 80 Å to 90 Å. Then a step 36 performs NLDD implant, clean, and anneal. 'Clean' refers, e.g, to photoresist removal. SiGe disposable silicon nitride deposition (DIS SIN dep) follows thereafter.

In various FIG. 2 embodiments at about 32 nm or 28 nm, the screen layer of horizontally-disposed SiN seal thickness for PLDD and NLDD and the spacer SiN seal thickness are both initially prepared in a range about 40 A to 80 A, with a preferred range of about 50 to 70 A (angstroms), and a preferred example value of about 60 A.

The anisotropic etch of step 33 prior to PLDD implant 34 diminishes this spacer SiN seal thickness dimension to an etched thickness or offset in an example range of 30 A to 70 A prior to PLDD implant 34, and a preferred example value is about 50 A.

The thicker screen offset layer of spacer SiN seal thickness for NLDD is prepared at step 35 in a range about 1.2 to 2 times the thickness of the horizontally-disposed SiN seal initial thickness, and is about 1.5 to 2.5 times at step 35 of the etched thickness of the spacer SiN seal due to step 33 prior to PLDD implant 34. Accordingly, that step 35 thicker screen offset layer of spacer SiN seal thickness for NLDD is prepared in a range about 50 A to 120 A with a preferred range of about 60 A to 100 A, and some further-narrowed example values in a range 80 A to 90 A. In at least some of the embodiments, the initial offset established by step 33 for PLDD implanting step 34 is in a range about 45% to about 75% of the augmented offset established by step 35 for NLDD implanting step 36. In the resulting manufactured integrated circuits, the NLDD structure correspondingly provides a source/drain extension at step 36 defining an nFET channel length offset from the gate structure and in a range 1.5 to 2.5 times the pFET channel length resulting from the PLDD implanting with smaller offset at step 34. For other screen materials, process nodes, and process embodiments, the ranges and thicknesses may be adjusted according to the teachings herein to achieve p-type and n-type transistors with desired performance characteristics and parameters.

Wafers according to some process embodiments are fabricated using arsenic (As) NLDD, 2 Kev energy, 4E15 As/cm$^2$ dosage, and zero wafer tilt from normal incidence for the implant. A useful tilt range is zero tilt (0) up to 25 degrees tilt. (The 2 Kev energy is not critical and can be between 0.5 Kev to 5 Kev where increasing energy in the range generally decreases implant time and increases implant depth.) With increasing tilt beyond that NLDD is believed to excessively penetrate laterally into the channel region due to increasing horizontal component (parallel to substrate) of dopant velocity. For some background on wafer fabrication see US Patent Application Publication 20090170259 "Angled Implants with Different Characteristics on Different Axes" (TI-63482) dated Jul. 2, 2009, and U.S. Pat. No. 6,808,997 "Complementary Junction-Narrowing Implants for Ultra-Shallow Junctions" (TI-31239) dated Feb. 24, 2005, U.S. Pat. No. 7,297,605 "Source/Drain Extension Implant Process for Use with Short Time Anneals" (TI-36967) dated Nov. 20, 2007, and U.S. Pat. No. 7,670,917 "Semiconductor Device Made by Using a Laser Anneal to Incorporate Stress into a Channel Region" (TI-62188) dated Mar. 2, 2010, each of which is hereby incorporated herein by reference in its entirety.

Some other wafers according to other process embodiments are prepared with 15 degrees tilt. To avoid shadowing or unevenness of the dosage by vertically-extending structures like the gate stack, the dosage is applied in portions (such as ¼) while progressively turning the wafer through a twist angle such as one-quarter (¼) turn or 90 degrees twist. A p-type pocket implant or halo implant is performed so that the n-type doping does not pinch the channel in an nFET, and the p- and n-types are reversed for a pFET. (Note that the actual geometry of cross-sections of LDD with pocket implants will vary from the nominally-sketched source/drains that FIGS. 1 and 2 show.) Pocket implant is performed, for one example, at 30 KeV applying boron p-dopant (i.e. opposite type to the NLDD implant n-dopant type) using BF2 (boron diflouride) with a dosage of 5E13/cm2 at tilt 30 degrees. For the pocket implant a useful tilt range is between fifteen (15) degrees and sixty (60) degrees tilt, and a preferred tilt sub-range is between twenty-five (25) degrees and forty-five (45) degrees tilt. Temperatures for NLDD anneal according to a first way applies a rapid thermal anneal 900-1000 deg C., also called a spike, of very brief duration to prevent undue diffusion of dopant while allowing crystal lattice damage to repair, and activating the dopant. Alternatively, the NLDD anneal can be a laser anneal at 1150-1300 degrees C. Other dopants, dosages, tilt angles, and other processes and variations are applied by the skilled worker to provide still other process embodiments. Other p-dopants besides or mixed with boron B can be aluminum Al, gallium Ga and/or indium In. Other n-dopants besides or mixed with arsenic As can be phosphorus P and/or antimony Sb. LDD dosages are, e.g. on the order of 1E15-1E16/cm$^2$ or even higher at advanced processes beyond (smaller than) 22 nm. Pocket dosages are on the order of 1E13-1E14/cm$^2$.

Figure 3:
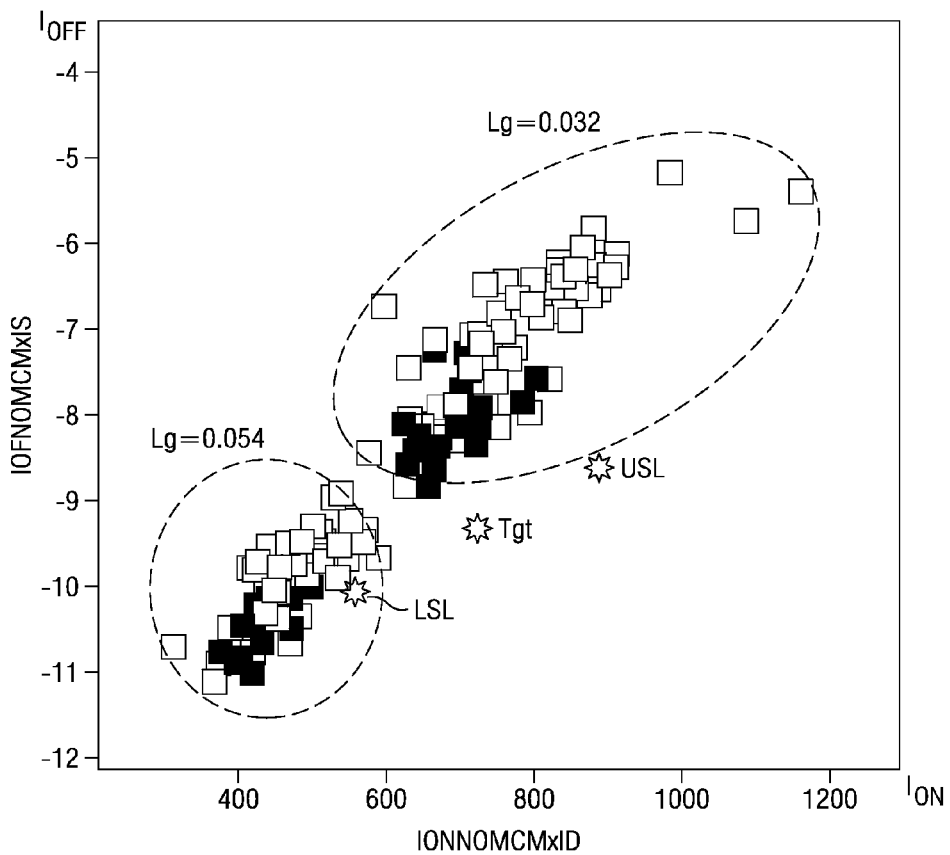
FIG. 3 is an analysis diagram or plot on-current versus off-current $I_{on}$ vs. $I_{off}$ for two groups of wafers having transistors of gate lengths of 54 nm in a first group of wafers and 32 nm gate length transistors in the second group of wafers.

In FIG. 3, a split analysis plot shows a testing method for analysis of on-current versus off-current $I_{on}$ vs. $I_{off}$ for two groups (splits) of wafers having transistors of respectively different gate lengths Lg of 54 nm in the first group and 32 nm in the second group, both according to a baseline manufacturing process. The groups occupy different regions in FIG. 3, as indicated by the non-intersecting dotted lines of the plot, indicating substantial desirable process uniformity or process control at each node. The testing method then measures wafers from split lots for a process embodiment such as in FIG. 2 involving a special flow including poly etch and dual seal (steps 32, 35), for 54 nm gate length and 32 nm gate length. Such resulting wafers would be plotted and then compared with the FIG. 3 results for the baseline.

Running in a split lot can include decreasing a pocket dose and increasing an angled LDD dose for the split having the smaller of e.g. first and second gate lengths compared with the other split. Decreasing pocket PKT dose from 6.5E13 at 54 nm to 5.0E13 at 32 nm and increasing an angled LDD dose from 1.6E15 at 54 nm to between about 4.0 and about 6.0E15 at 32 nm can yield favorable splits. (An angled dose is offset at a physical angle from a line perpendicular to the substrate.)

In FIG. 3, switching performances are indicated with respect to a target point Tgt, shown as a first star representing target ($I_{off}$, $I_{on}$) coordinate values. Example upper and lower specification limits USL and LSL are shown as two more stars so-designated and accompanying the target Tgt, such as to represent a desired range between the value of a desired mean (target Tgt) plus 95% confidence and the value of target Tgt minus 95% confidence. Testing in some test process embodiments measures switching performances of an off-current $I_{off}$ and an on-current $I_{on}$ with respect to a pair of target point Tgt coordinates ($I_{off}$, $I_{on}$) and defines a range by upper and lower confidence limits USL and LSL above and below the target Tgt respectively and determines whether a condition of separation between the splits exists or not.

The testing method suitably further checks Gate-to-drain Capacitance Cgd in fF/um (femtofarads per micron) at 32 nm as well as DIBL (drain induced barrier lowering) in volts at gate length 54 nm (nanometers) in a 32 nm process. Wafers are run in split lots to check DIBL values and Cgd for baseline technology not using a process embodiment and then run using a process embodiment. "Split" refers to a split lot, e.g., to the different groups of wafers are suitably run in split lots fabricated using different process parameters in a wafer fabrication process for experimentation purposes. Testing in some test process embodiments includes determining a transistor threshold voltage reduction between the splits representing drain induced barrier lowering (DIBL) voltage and whether DIBL is less than a given DIBL voltage value or not, or alternatively whether DIBL lies in a given voltage range (e.g., ⅛-to-⅙ volt) or not. (DIBL refers to a FET threshold voltage reduction as drain voltage is increased or as channel length is reduced, such as by the shorter channel length at a more advanced process node. Also, high DIBL can undesirably increase off current Ioff at a given gate turn-off bias voltage.) Cgd values at this node may be on the order of, or approximately around, 0.2 fF/um. (The single digit of precision is used to indicate a range 0.15-to-0.25 fF/um in which values might occur instead of a measured value of Cgd.) DIBL values at this node may be on the order of, or approximately around, one-seventh of a volt. The splits are tested and optimized for desirably low actual values of both DIBL and Cgd. Testing in some test process embodiments measures gate-to-drain capacitance Cgd for at least the split with the smaller of first and second gate lengths and determines whether Cgd lies in a given range (e.g., 0.15-to-0.25 fF/um) or not.

As noted above, the FIG. 2 process embodiment is not just a swap of PLDD and NLDD, due to the double offset for NLDD but not for PLDD. Note that in FIG. 2 the smaller spacer width 33 and PLDD formation 34 are executed prior to the larger spacer width at step 35 and NLDD formation 36. This sequence beneficially builds the larger spacer width after, and by augmenting, the smaller spacer width. Also, etching conveniently stops at an etch stop at step 33, and etching is unnecessary and absent at step 35.

Providing a different, larger spacer width for NLDD implant than for PLDD implant confers a larger offset from the gate stack for NLDD implant. Another alternative type of embodiment can alternatively employ a sequence wherein that larger spacer width for NLDD implant comes before instead of after PLDD and represents a remarkable modification of FIG. 1. A thick screen (e.g., 80-90 A) is laid down first and then NLDD implant 13 is executed. Subsequently, a thick initial SiN seal on the spacer would be decreased in width prior to PLDD implant 15. Given a single material, such as an SiN seal, this calls for a timed etch to stop the etch at the decreased dimension before reaching an etch stop using end point detection. Multiple timed anisotropic etches may be applied such as respectively prior to NLDD and prior to PLDD. Alternatively to a timed etch on single material, an etch on a multi-layered material such as nitride/oxide/nitride (N/O/N) decreases the seal thickness on the spacer by etching outer nitride of N/O/N down to the oxide (O) within as the etch stop.

Note that some embodiments can use the spacer augmentation process with transistors of opposite conductivity type and for which desirable transistor performances are specified for each. Some other embodiments can use the spacer augmentation process with transistors of the same conductivity type but for which different transistor performances are specified. In that case, patterned photoresist areas 53 and 55 are situated spatially elsewhere on the chip outside of view of the FIG. 2 cross-section. Still other embodiments can use successive spacer augmentation processes (more than one pair of steps 35 and 36) in an overall process to form multiple sets of transistors of a same conductivity type and one or more sets of transistors of the opposite conductivity type too, for which sets particular transistor performances are specified. For that case, a succession of patterned photoresist areas 53 and then 55 (and then 55') are situated with some in the FIG. 2 cross-section and others spatially elsewhere on the chip outside of view of the FIG. 2 cross-section as the process proceeds.

In FIG. 2, it was noted that if the gate is metal, then the gate formation occurs and spacer formation occurs according to such metal gate process. In a replacement gate type of metal gate process embodiment coordinated with FIG. 2, the process builds a polysilicon (poly) gate, then removes the poly gate and fills the gate region with metal, called a replacement gate. This replacement gate process has a modest thermal budget. Adjustments in the process portion depicted in FIG. 2 can be set so that a thermal effect of the gate formation beforehand or afterwards, which can further diffuse or otherwise affect the source/drain structure underneath, results in the desired final LDD structure with its drain extensions and junction depth. FIG. 2 focuses on how the LDD structures themselves are provided.

Another approach to metal gate formation is called fully-silicided (FUSI) gate, and other metal gate formation processes are envisaged. Metal gates involve thermal cycles and so does the LDD. Accordingly, the skilled worker coordinates the LDD and metal gate thermal cycles so that physical gate integrity and a desired metal work function are obtained or maintained and so that the LDD structure is appropriately shallow (low DIBL) and avoids undue lateral diffusion or drain extension (low Cgd) to realize an embodiment as taught herein with metal gate.

To implement a particular desired integrated circuit that is designed and defined by a netlist of the functional electronic circuits, a form of computer software and system, called a layout tool or place-and-route tool or simply a tool, is used to situate and define the geometric arrangement of the transistors, conducting lines, contacts, vias and their interconnections with the semiconductor devices.

In the various embodiments of the present invention, a design process for implementing the methods described above can be implemented in a design tool including automatic error checking Circuit design tools can include tools based on or distributed by Cadence™, Synopsys™, Mentor graphics™, Magma Design Automation™, or otherwise.

The layout embodiments can be implemented in masks for contact, proximity, or projection photolithography processes. The masks can be designed to operate with any light source, including such as G-line, H-line, and I-line resist processes. The masks can also be designed to be used with KrF and ArF laser resist processes. Furthermore, the masks can be designed to operate with DUV (deep ultraviolet), EUV (extreme ultraviolet), and X-ray resist processes.

Figure 4:
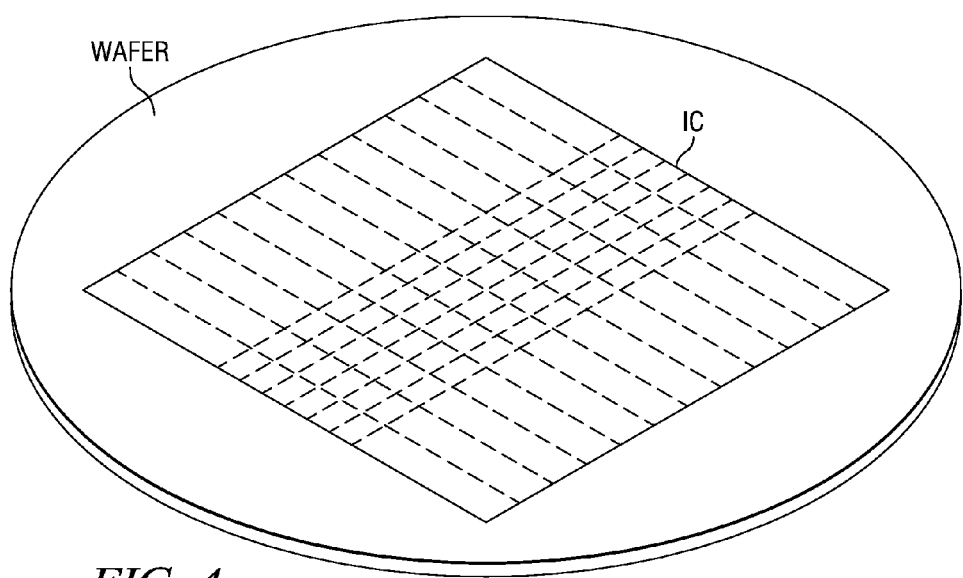
FIG. 4 is a pictorial diagram of a wafer with a magnified instance of a system or system-on-chip (SOC) integrated circuit IC embodiment including improvements according to the other Figures herein.

In FIG. 4, an integrated circuit IC structure can include various elements therein and/or layers thereon. These can include metal or other interconnect layers, barrier layers, dielectric layers, device structures, active elements and passive elements including word lines, source regions, drain regions, gates, conductive lines, conductive contacts and vias, etc. Moreover, the embodiments may be provided to form a CMOS (complementary metal oxide semiconductor) structure, SiGe(silicon germanium, silicon on insulator SOI, strained silicon or stressed channel in any semiconductor, single-gate and multiple-gate (MUGFET or FINFET) field effect transistors, and integrated circuit structures in gallium arsenide or other materials systems.

An electronic design process flow is used for automatically designing integrated circuits. A high-level hardware design language RTL is used in a workstation at which a designer prepares by step a high-level functional description of the hardware. Then the RTL is converted to a netlist that specifies the circuit components and their interconnections at the transistor level. Place and route operations commence and proceed to input library cells, if not already stored, and obtain the netlist. Next, a tool applies a set of steps sequentially or iteratively utilizes selections of cells in situating such cells near other cells to realize various parts of the design in place and route regions. Pattern generation takes the tool-generated place and route information and formats into an output ready to control production of the target chip in a wafer manufacturing fabrication factory according to a process embodiment including the process sequence in FIG. 2. The PG database is accessed and used to control various wafer fab equipment units that perform seals, implants, chemical vapor deposition CVD, plasma etch, wet etch, anneals, and/or other steps. The collective operation of some or all these fab equipments or other equipment units is selected and controlled to achieve completion of an effective manufacturing process at an advanced process node.

After wafer fabrication, the manufacturing process proceeds to a wafer/die test step. Dice that pass wafer/die test go to assembly/test step for packaging and test, followed by delivery of good packaged integrated circuit product. Some dice may be sent to remediation and further testing. Some other dice may be scrapped due to manufacturing reasons. Some dice may fail and indicate advisability of return for re-layout or design corrections beforehand.

In FIG. 2, the structure and process flow and example shown is part of a more extensive fabrication process. One such process beforehand patterns and implants N-type buried layers NBL Implant into a P+ Substrate, and then overlays it with a P-epitaxial layer by P-EPI Deposition. Well Pad Oxidation is followed by NWell Implant and PSD source/drain implant and diffusion which is detailed according to teachings hereinabove. Then pre-metal dielectric PMD is deposited and patterned. Other parts of IC manufacture include gate oxide formation and gate fabrication, contact deposition, interconnect, inter-level dielectric ILD, and higher metal layers and dielectric. FIG. 2 pertains to the part relating to FET transistor formation.

It is contemplated that the skilled worker provides and uses the resulting integrated circuits or cores in various types of integrated circuit chips, or provided into one single integrated circuit chip, in a manner optimally combined or partitioned between the chips, to the extent needed by any of the applications supported by a personal computer(s) with microprocessors, various modems, cellular telephones, radios and televisions, Internet audio/video content players, fixed and portable entertainment units, tablets, video phones, routers, pagers, personal digital assistants (PDA), organizers, scanners, faxes, copiers, household appliances, office appliances, embedded devices with microcontrollers coupled to controlled mechanisms for fixed, mobile, personal, robotic and/or automotive use, combinations thereof, and other application products now known or hereafter devised for increased, partitioned or selectively determinable advantages.

ASPECTS (See Explanatory Notes at End of this Section)

18A. The process claimed in claim 18 wherein the gate structure includes polysilicon (poly) and the gate etching includes post-poly patterning and then re-oxidation, and the forming of the spacer includes depositing the spacer to include silicon nitride, and spacer etching to establish an initial spacer offset prior to the PLDD.

18B. The process claimed in claim 18 wherein the forming of the spacer includes depositing the spacer including silicon nitride and oxide, and spacer etching prior to the PLDD to establish a spacer offset while leaving some remanent oxide due to incomplete spacer etching, wherein the depositing of a layer has the layer including a silicon nitride SiN seal to substantially augment the spacer offset.

18C. The process claimed in claim 18 wherein the process establishes gate-drain capacitance (Cgd) of approximately 0.2 femtofarad per micro-meter, whereby avoiding excessive drain extension beneath the gate.

18D. The process claimed in claim 18 wherein the NLDD implanting accomplishes drain-induced barrier lowering (DIBL) of approximately one-seventh volt or less, whereby indicative of shallow drain depth.

18E. The process claimed in claim 18 wherein the process is selected from the group consisting of: 1) CMOS (complementary metal oxide semiconductor), 2) SiGe (silicon germanium, 3) SOI (silicon on insulator), 4) strained silicon, 5) stressed channel semiconductor.

18F. The process claimed in claim 18 further comprising depositing at least a second implant-energy-reducing layer after said NLDD to further augment an offset of the spacer from the gate structure and form a thicker horizontal screen free of etch; and a second (NLDD) implanting of n-type source/drain extensions.

33A. The process claimed in claim 33 wherein the metal gate process is selected from the group consisting of 1) fully-silicided (FUSI), and 2) replacement gate process.

33B. The process claimed in claim 33 wherein the metal gate process includes coordinating thermal cycles for the lateral drain diffusion and metal gate so that physical gate integrity and a metal work function for p-type and n-type metal-gate transistor operations are obtained.

38A. The process claimed in claim 38 wherein the adding of seal substance augments the spacer offset horizontally so the augmented spacer offset lies in a range about 1.2 to 2 times the thickness of the horizontal screen.

38B. The process claimed in claim 38 wherein the horizontal screen has a thickness in a range of 50-70 A and the augmented spacer offset horizontally lies in a range of 80 A-100 A.

38C. The process claimed in claim 38 wherein the horizontal screen includes a SiN seal material.

38D. The process claimed in claim 38 further comprising, prior to the PLDD, forming an incidental horizontal screen concurrently with the initial spacer structures wherein said incidental horizontal screen has a seal material having a seal thickness on the initial spacer structures.

38D1. The process claimed in claim 38D wherein the incidental horizontal screen includes at least layers with respective nitride and oxide (N/O) and the process further comprises etching the outer nitride of the N/O down to the oxide (O) within as an etch stop.

39A. The integrated circuit article claimed in claim 39 wherein said NLDD includes arsenic (As) LDD doping in a range $4E15/cm^2$-to-$6E15/cm^2$.

39B. The integrated circuit article claimed in claim 39 wherein said NLDD includes a pocket implant with approximately $5E13/cm^2$ boron doping.

39C. The integrated circuit article claimed in claim 39 wherein said NLDD structure establishes gate-drain capacitance (Cgd) approximately 0.2 femtofarad per micro-meter.

39D. The integrated circuit article claimed in claim 39 wherein said gate structure is in a range 32 nm to 28 nm.

39E. The integrated circuit article claimed in claim 39 wherein at least one of said NLDD and PLDD provides drain-induced barrier lowering (DIBL) approximately one-seventh of a volt, whereby indicative of shallow drain depth.

43A. The wafer fabrication testing method claimed in claim 43 further comprising measuring switching performances of an off-current $I_{off}$ and an on-current $I_{on}$ with respect to a pair of target point Tgt coordinates ($I_{off}$, $I_{on}$), providing a range defined by upper and lower confidence limits USL and LSL above and below the target Tgt respectively, and determining whether a condition of separation between the splits exists or not.

43B. The wafer fabrication testing method claimed in claim 43 wherein the split with the smaller of the first and second gate lengths has a p-type lateral drain diffusion (PLDD) structure providing a source/drain extension and defining at least a first field effect transistor channel length and at least one n-type lateral drain diffusion (NLDD) structure providing a source/drain extension defining at least a second field effect transistor channel length offset from the gate structure and the second channel length lying in a range 1.5 to 2.5 times the first channel length.

43C. The wafer fabrication testing method claimed in claim 43 further comprising measuring gate-to-drain capacitance Cgd for at least the split with the smaller of the first and second gate lengths and determining whether Cgd lies in a given range or not.

43C1. The wafer fabrication testing method claimed in claim 43C wherein the given range for Cgd is included in a range 0.15 to 0.25 femtofarad per micro-meter.

43D. The wafer fabrication testing method claimed in claim 43 wherein the given DIBL voltage is approximately one-seventh volt or less.

Notes: Aspects are description paragraphs that might be offered as claims in patent prosecution. The above dependently-written Aspects have leading digits and may have internal dependency designations to indicate the claims or aspects to which they pertain. The leading digits and alpha-numerics indicate the position in the ordering of claims at which they might be situated if offered as claims in prosecution.

Process diagrams herein are representative of flow diagrams for operations of any embodiments using any one, some or all of hardware, software, or firmware, and processes of manufacture thereof. Flow diagrams and block diagrams are each interpretable as representing structure and/or process. While this invention has been described with reference to illustrative embodiments, this description is not to be construed in a limiting sense. Various modifications and combinations of the illustrative embodiments, as well as other embodiments of the invention may be made. The terms including, includes, having, has, with, or variants thereof are used in the detailed description and/or the claims to denote non-exhaustive inclusion in a manner similar to the term comprising.

While various embodiments of the present invention have been described above, it should be understood that they have been presented by way of example only, and not of limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of integrated circuit manufacturing comprising:
   providing a first gate stack and a second gate stack over a substrate;
   forming a spacer on the sidewalls of the first gate stack and the second gate stack to provide a first horizontal offset over a first channel region under the first gate stack;
   performing a PLDD implant adjacent the first gate stack having the first horizontal offset provided by said spacer;
   after performing the PLDD implant, depositing a seal substance over the spacer, the first gate stack and the second gate stack to provide a screen thickness vertically while thereby augmenting the spacer on the second gate stack to provide a second, increased, offset horizontally from the second gate stack; and
   subsequently providing an NLDD implant dose for NLDD formation using the unetched seal substance as a horizontal screen.

2. The process claimed in claim 1 wherein the seal substance comprises at least one energy-reducing substance to reduce average energy of the NLDD implant dose entering the substrate to form n-type the source and drain extensions and thereby make the NLDD junction depth shallower.

3. The process claimed in claim 1 wherein the seal substance includes silicon nitride (SiN).

4. The process claimed in claim 1 wherein said step of forming a spacer comprises depositing a spacer material having a spacer thickness in a range about 40 A to 80 A.

5. The process claimed in claim 4 wherein said steps of forming the spacer further includes anisotropic etching to diminish the spacer thickness to a range 30 A to 70 A prior to PLDD implant.

6. The process claimed in claim 1 wherein said second horizontal offset is in a range of about 1.2 to 2 times a thickness of the seal vertically.

7. The process claimed in claim 1 wherein said second horizontal offset is in a range about 1.5 to 2.5 times the first horizontal offset of the spacer prior to PLDD implant.

8. The process claimed in claim 1 wherein the second horizontal offset is in a range of about 50 A to 120 A.

* * * * *